(12) United States Patent
Liu

(10) Patent No.: US 6,236,274 B1
(45) Date of Patent: May 22, 2001

(54) SECOND HARMONIC TERMINATIONS FOR HIGH EFFICIENCY RADIO FREQUENCY DUAL-BAND POWER AMPLIFIER

(75) Inventor: Shih-Ping Liu, Kaouhsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/477,425

(22) Filed: Jan. 4, 2000

(51) Int. Cl.[7] ................................................. H03F 3/04
(52) U.S. Cl. ................................... 330/302; 330/306
(58) Field of Search ................................. 330/126, 286, 330/302, 306, 129

(56) References Cited

U.S. PATENT DOCUMENTS

| | | |
|---|---|---|
| 4,717,884 | 1/1988 | Mitzlaff . |
| 5,095,285 | 3/1992 | Khatibzadeh . |
| 5,159,287 | 10/1992 | Furutani et al. . |
| 5,229,732 * | 7/1993 | Furutani et al. ................. 330/277 |
| 5,406,224 * | 4/1995 | Mikami et al. ................... 330/277 |
| 5,592,122 | 1/1997 | Masahiro et al. . |
| 5,774,017 | 6/1998 | Adar . |
| 5,905,409 * | 5/1999 | Fujimoto et al. ................. 330/302 |
| 6,163,221 * | 12/2000 | Matsuno ........................... 330/302 |

OTHER PUBLICATIONS

Paul M. White, "Effect of Input Harmonic Terminations On High Efficiency Class–B and Class–F Operation of Phemt Devices", 1998 IEEE MTT–S Digest, pp. 1611–1614.

David M. Snider, "A Theoretical Analysis and Experimental Confirmation of the Optimally Loaded and Overdriven RF Power Amplifier", IEEE Transactions on Electron Devices, vol. ED–14, No. 12, Dec. 1967, pp. 851–857.

* cited by examiner

Primary Examiner—Robert Pascal
Assistant Examiner—Henry Choe
(74) Attorney, Agent, or Firm—Stevens, Davis, Miller & Mosher, LLP

(57) ABSTRACT

A high efficiency dual-band RF power amplifier has an output and/or input of a high frequency transistor well terminated at the second harmonic frequency for dual-band operation. Diode switches or voltage controlled varactors implement dual-band resonators such that they can offer low impedance at the second harmonic of each frequency band, while, in some cases, presenting high impedance at the fundamental frequency as an RF choke circuit.

21 Claims, 9 Drawing Sheets

SECOND HARMONIC TERMINATIONS FOR HIGH EFFICIENCY RADIO FREQUENCY DUAL-BAND POWER AMPLIFIER

BACKGROUND OF THE INVENTION

1. Field of the Invention

The present invention relates to dual-band RF (Radio Frequency) power amplifiers. More particularly, this invention relates to high efficiency RF power amplifiers having a switching circuit, which creates a low impedance at the second harmonic of each frequency band, for dual-band operation.

2. Description of the Related Art

In portable wireless communication systems, there is a strong need for power amplifiers with high efficiency to maximize the amount of talk time obtained from a power source, such as a battery. It is well known in the art of RF power amplifiers to consider both the fundamental frequency, and harmonic components of the fundamental frequency, for increasing the efficiency to an optimal level. In addition to obtaining impedance matching at the fundamental frequency, the efficiency is increased by conditions that provide zero impedance for even multiples (even harmonics) of the fundamental frequency. The following background documents are incorporated by reference herein in their entireties:

[1] D. M. Snider," A Theoretical Analysis and Experimental Confirmation of the Optimally Loaded and Overdriven RF Power Amplifier," *IEEE Tran, Electron Devices*, vol. ED-14, pp. 851–857, December 1967.

[2] J. E. Mitzlaff, "High Efficiency RF Power Amplifier," U.S. Pat. No. 4,717,884, January 1988.

[3] M. A. Khatibzadeh, "Monolithically Realizable Harmonic Trapping Circuit," U.S. Pat. No. 5,095,285, March 1992.

[4] N. Furutani, et al., "High Efficiency RF Power Amplifier," U.S. Pat. No. 5,159,287, October 1992.

[5] P. M. White, "Effect of Input Harmonic Terminations of High Efficiency Class-B and Class-F Operation of PHEMT Devices," *IEEE MIT-S Dig.*, pp. 1611–1614, 1998.

[6] M. Masahiro, et al., "Radio-Frequency Power Amplifier with Input Impedance Matching Circuit Based on Harmonic Wave," U.S. Pat. No. 5,592,122, January 1997.

[7] A. Adar, "Multiple-Band Amplifier," U.S. Pat. No. 5,774,017, June 1998.

A Class F amplifier is well known as a device which operates primarily as a switch. For this reason, the power dissipation is lower and the stage efficiency is higher than for other amplifiers. Class F operation is characterized by limiting the voltage across the active device to approximately twice the supply voltage [reference 2]. Class F power amplifiers are a most popular design because they are known for high efficiency, wherein the impedance at even harmonic frequencies at the transistor output (drain or collector) is set to a short-circuit (low impedance), and the impedance at the odd harmonic frequencies at the transistor output is set to an open-circuit (high 8 infinite impedance) [references 1–4]. The derivation of the harmonic impedance of a Class F amplifier [reference 1] is based on a Class B biasing operation. In Class B operation, the current flows for only 180° of the AC cycle, whereas in Class A operation, the transistor is active for 360° of the AC cycle for a linear reproduction of the input. When the amplifier is biased at a Class AB state (which is a hybrid between Class A and Class B operation, i.e. the bias voltage is chosen so that current flows for more than half of the cycle for higher efficiency than Class A but does not provide a linear reproduction like Class A), the impedance of the even harmonics is still zero, but the impedance of the odd harmonics is no longer infinite.

In addition, it is well known that second harmonic frequency termination is a dominant factor in improving the efficiency of a power amplifier. Furthermore, providing the second harmonic termination at the transistor input (gate or base), in addition to the transistor output, may improve the overall efficiency significantly [references 5, 6].

FIG. 1 shows a circuit diagram of a conventional single band high efficiency power amplifier. The even harmonic resonator 1 provides zero impedance for the second harmonic, and the input and output fundamental matching network 2,3 provides the prescribed load impedance at the fundamental frequency to Field Effect Transistor (FET) 4. However, dual-band operation in portable units is becoming indispensable because of dual-band communication systems, such as GSM (Global System for Mobil Communications).

However, the conventional high efficiency power amplifier shown in FIG. 1 can not provide dual-band operation. Although two single band power amplifiers, each of which operate at a specific frequency band, can be used in a dual-band handset (e.g., a telephone), a single dual-band amplifier provides instant reductions in the costs of manufacture and allows for a reduction in the size of the respective device, and saves power.

In addition, in the dual-band GSM system, the second harmonic of the cellular frequency band (around 900 MHz) is within the fundamental PCS (Personal Communications System) frequency band (around 1800 MHz). These frequency values indicate that a high efficiency GSM dual-band power amplifier should provide a low impedance at around 1800 MHz at the transistor output (or/and input) under cellular-band operation, and provide a prescribed impedance at around 1800 MHz and a low impedance at around 3600 MHz under PCS-band operation. Thus, there is a need for a single amplifier having dual-band capabilities that overcomes the problems of the prior art.

SUMMARY OF THE INVENTION

Accordingly, it is an object of the present invention to develop a high efficiency RF power amplifier for dual-band application.

To this end, according to the present invention, there is provided a high efficiency dual-band RF power amplifier which comprises (1) a power transistor having an input and an output; (2) a dual-band input impedance matching circuit connected to the input of the power transistor for providing input impedance matching for the RF power amplifier at two desired fundamental frequency bands; (3) a dual-band output impedance matching circuit connected to the output of the power transistor for providing output impedance matching for the RF power amplifier at two desired fundamental frequency bands; and (4) a combined dual-band bias circuit and second harmonic frequency termination circuit connected to one or both of the output and the input of the power transistor for providing an RF choke at a fundamental wave frequency and for providing a low impedance at a second harmonic frequency with respect to the fundamental wave frequency of each band.

The dual-band bias circuit and harmonic frequency termination circuit can include a band select voltage terminal for receiving a band select voltage. The dual-band input impedance matching circuit can comprise a passive dual-band network. The dual-band input impedance matching circuit can comprise one of a duplexer and a switch for providing impedance matching at two frequency bands of dual-band operation. The dual-band output impedance matching circuit can comprise a passive dual-band network. The dual-band output impedance matching circuit can comprise one of a duplexer and a switch for providing impedance matching at two frequency bands of dual-band operation.

The combined dual-band bias circuit and second harmonic frequency termination circuit can comprise (a) a bias circuit comprising: a transmission line and a bypass capacitor; the transmission line having an electric length which is approximately $1/20^{th}$ of the fundamental wave frequency; a first end of the transmission line being connected to a first bias terminal and the bypass capacitor; a second end of the transmission line being connected to the output terminal of the power transistor; and (b) a second harmonic frequency termination circuit connected to the bias circuit, the second harmonic frequency termination circuit comprising: a first series resonant circuit comprising a cascaded inductor and capacitor, the first series resonant circuit having a first end connected to the output terminal of the power transistor and a second end connected to ground; a second series resonant circuit comprising a cascaded inductor and capacitor, the second series resonant circuit having a first end connected to the output terminal of the power transistor, a switch having a first end connected to a second end of the second series resonant circuit and a second end connected to ground; a bias resistor connected to the first end of the switch and to a second bias terminal for providing a band select voltage so that the switch receives a band select voltage (Vb) from the second bias terminal via said bias resistor.

The switch can be a diode having an anode and a cathode, where the cathode of the diode is connected to ground; and the anode of the diode is connected to the bias resistor for receiving the band select bias voltage (Vb) from the second bias terminal.

The combined dual-band bias circuit and second harmonic frequency termination circuit can alternatively comprise: (a) a bias circuit comprising a transmission line and a bypass capacitor; the transmission line having an electric length of approximately a quarter wavelength at a fundamental wave frequency of a lower frequency band; a first end of the transmission line being connected to a first bias terminal and the bypass capacitor; a second end of the transmission line being connected to the output of the power transistor; and (b) a second harmonic frequency termination circuit comprising: a first DC blocking capacitor having a first end connected to the first end of the transmission line; a diode for switching virtually between a lower frequency path and a higher frequency path through the transmission line, said diode having a cathode connected to a second end of the first DC blocking capacitor; a second DC blocking capacitor having one end connected to the anode of the diode and another end coupled to an interior point of the transmission line such that the length between the interior point and the second end of the transmission line is approximately a quarter wavelength at the fundamental wave frequency of a higher frequency band; a bias resistor having a first end connected to the anode of the diode and a second end connected to a second bias terminal for providing band select voltage; and an RF choke inductor having a first end connected to the cathode of the diode and a second end connected to ground to provide a DC return path.

The combined dual-band bias circuit and second harmonic frequency termination circuit can further alternatively include: (a) a bias circuit comprising a transmission line and a bypass capacitor; the transmission line having an electric length less than a quarter wavelength of the fundamental frequency; a first end of the transmission line being connected to a first bias terminal and the bypass capacitor; a second end of the transmission line being connected to the output terminal of the power transistor; and (b) a second harmonic frequency termination circuit comprising: a series resonant circuit comprising a capacitor, an inductor and a varactor, which are all cascaded, the series resonant circuit having a first end connected to the output terminal of the power transistor and a second end connected to ground; and an RF choke inductor having one end connected to the varactor and the inductor of the series resonant circuit and another end connected to a second bias terminal for providing a band select voltage.

The transmission line can have an electric length less than $1/20$th of a wavelength of the fundamental frequency.

According to the present invention, there is further provided a high efficiency dual-band RF power amplifier comprising (1) a power transistor having an input and an output; (2) a dual-band input impedance matching circuit connected to the input of the power transistor for providing input impedance matching for the RF power amplifier at two desired fundamental frequency bands; (3) a dual-band output impedance matching circuit connected to an output of the power transistor for providing output impedance matching for the RF power amplifier at two desired fundamental frequency bands; and (4) a dual-band second harmonic frequency termination circuit connected to one of the output and the input of the power transistor for setting a low impedance for a second harmonic frequency with respect to a fundamental wave frequency of each band.

The dual-band bias circuit and harmonic frequency termination circuit can include a band select voltage terminal for receiving a band select voltage. The dual-band input impedance matching circuit can comprise a passive dual-band network. The dual-band input impedance matching circuit can comprise one of a duplexer and a switch for providing impedance matching at two frequency bands of dual-band operation. The dual-band output impedance matching circuit can comprise a passive dual-band network. The dual-band output impedance matching circuit can comprise one of a duplexer and a switch for providing impedance matching at two frequency bands of dual-band operation.

The dual-band second harmonic frequency termination circuit can comprise (a) a series resonant circuit formed of a cascaded inductor, a capacitor and a varactor, the series resonant circuit having a first end connected to the output terminal of the power transistor and a second end connected to ground; and (b) an RF choke inductor with one end connected to the junction between the inductor and the varactor in the series resonant circuit and another end connected to a first bias terminal.

The dual-band second harmonic frequency termination circuit can alternatively comprise (a) a first transmission line and a second transmission line; (b) the first transmission line having an electrical length approximately $1/8^{th}$ of a wavelength at a fundamental wave frequency of a higher frequency band; (c) a DC blocking capacitor having one end connected to the output terminal of the power transistor and another end connected to a first end of the first transmission line; (d) a diode providing a switching function between the first and the second transmission line; the diode having an anode connected to a second end of the first transmission line and to a second bias terminal for providing a band select bias via a bias resistor and the diode having a cathode connected to one end of the second transmission line: and (e) an RF choke inductor connected at a first end to the cathode of the diode and a second end connected to ground; the second transmission line having an electrical length, when added to the length of the first transmission line, equal to approximately $\frac{1}{8}^{th}$ of a wavelength at a fundamental wave frequency of a lower frequency band; and another end of the second transmission line being open.

The dual-band second harmonic frequency termination circuit can further alternatively comprise: (a) a series resonant circuit comprising a transmission line having a first end connected to a first end of a capacitor and a second end connected to ground; the transmission line having an electrical length less than a quarter wavelength at a fundamental wave frequency of a lower frequency band; the capacitor having one end connected to the output terminal of the power transistor and another end connected to the first end of the transmission line; (b) a diode for providing virtually a switching function between a lower frequency path and a higher frequency path of the transmission line; the diode having a cathode coupled to an interior point of the transmission line; and (c) a DC blocking capacitor having one end connected to the first end of the transmission line and another end connected to an anode of the diode and to a second bias terminal for providing a band select voltage (Vb) via a bias resistor.

DETAILED DESCRIPTION OF THE PREFERRED EMBODIMENTS

Figure 1:
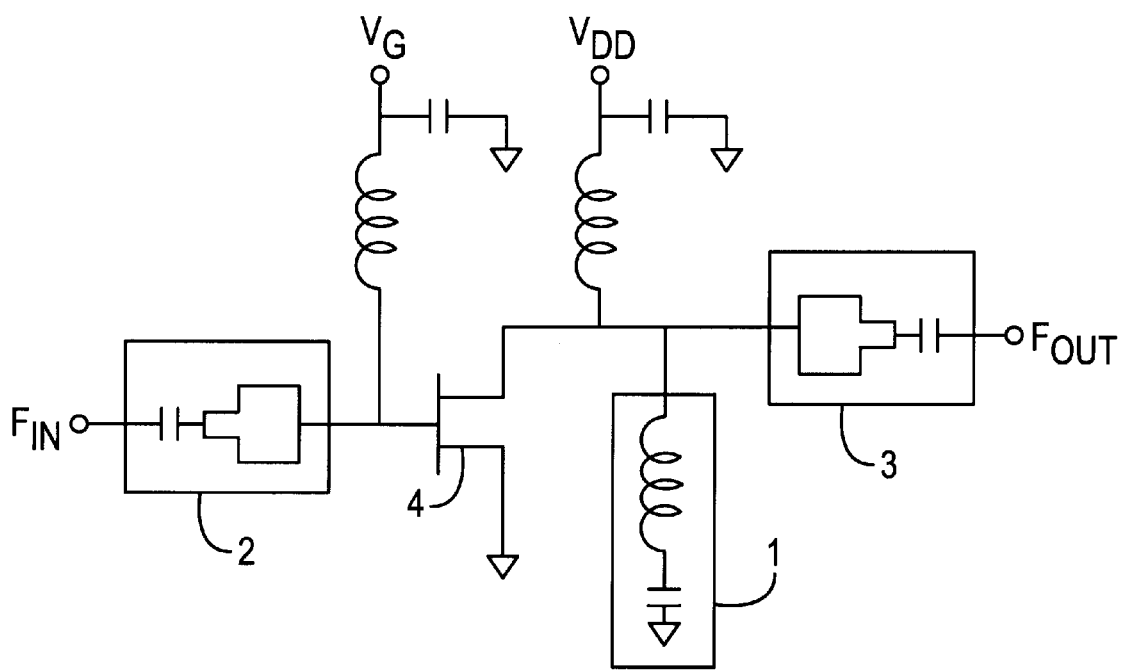
FIG. 1 is a circuit diagram showing an exemplary configuration of a conventional high efficiency RF power amplifier.
Figure 2A:
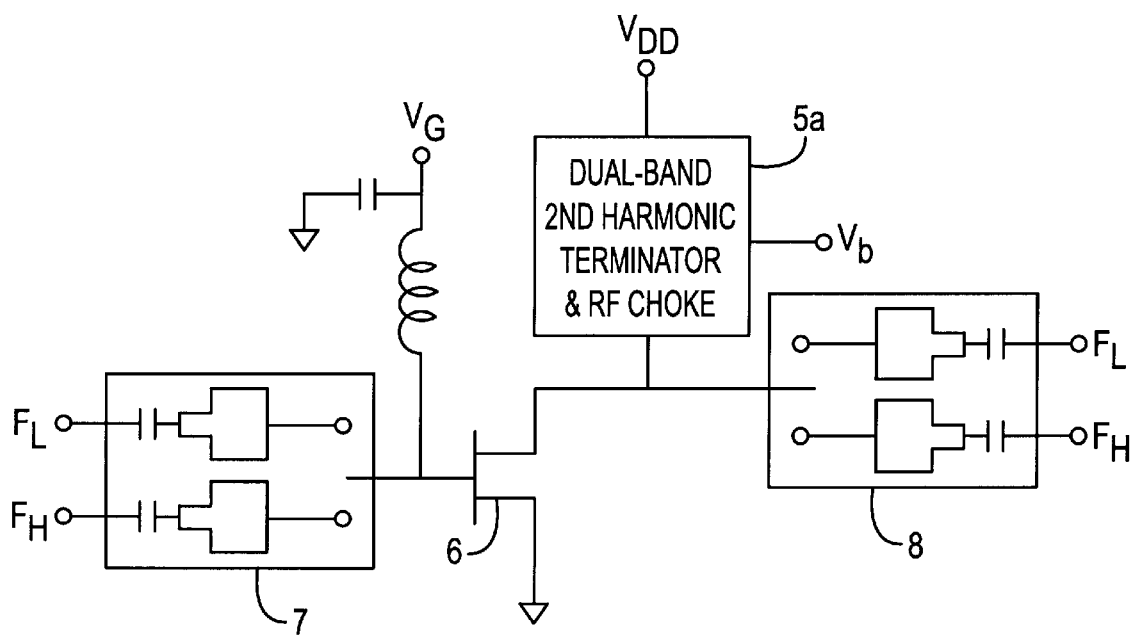
FIGS. 2A and 2B are circuit diagrams respectively showing the configurations of first and second embodiments of dual-band RF high efficiency power amplifiers according to the present invention.
Figure 2B:
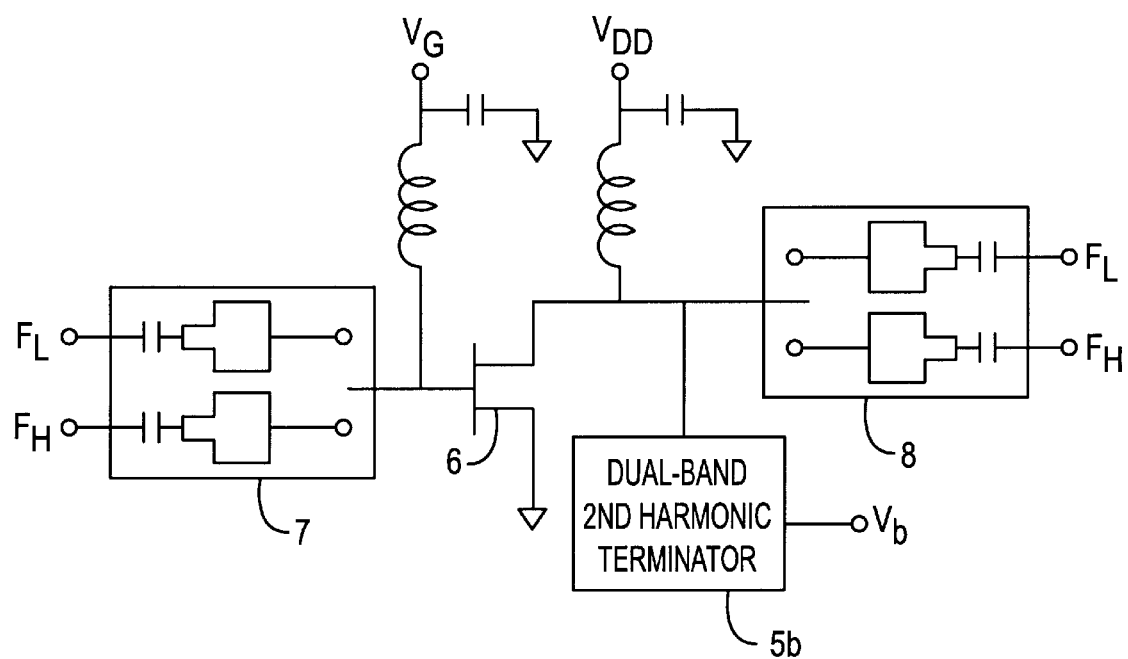

FIGS. 2A and 2B show two basic circuit diagrams of the present invention. The high efficiency dual-band power amplifier embodied in FIG. 2A includes a switching dual-band second harmonic termination circuit and RF choke 5a, whereas the power amplifier embodied in FIG. 2B provides only a dual-band second harmonic termination circuit 5b. In both embodiments, a control voltage Vb provides a control voltage to determine which band is selected. It should be noted that while the disclosed embodiments exemplify dual-band systems, the implementation of three or more band systems would involve similar structure and operation.

The power transistor 6 can be an FET or a BJT (bipolar junction transistor). The dual-band fundamental matching network 7, 8 provides a passive dual-band matching network, or a two-path matching network split by a passive duplexer or an active switch. The dual-band harmonic termination circuits 5a, 5b can be implemented by various resonators including a switch or a varactor by which an external control voltage can select different operation bands. For high efficiency, the dual-band harmonic termination circuits may be arranged at either the transistor output or input or both, depending on the specific design. According to the present invention, some of the dual-band harmonic termination circuits can only provide a low impedance at the second harmonic (FIG. 2B), while others (FIG. 2A) can additionally provide a high impedance at the fundamental wave. This high impedance at the fundamental wave allows the dual-band harmonic termination circuit to be utilized as an RF choke in the bias circuit, as shown in FIG. 2A.

The first embodiment of the present invention includes a fundamental frequency RF choke and a second harmonic frequency termination circuit 5a for dual-band operation, whereas the second embodiment only provides a dual-band second harmonic frequency termination circuit 5b.

Figure 3:
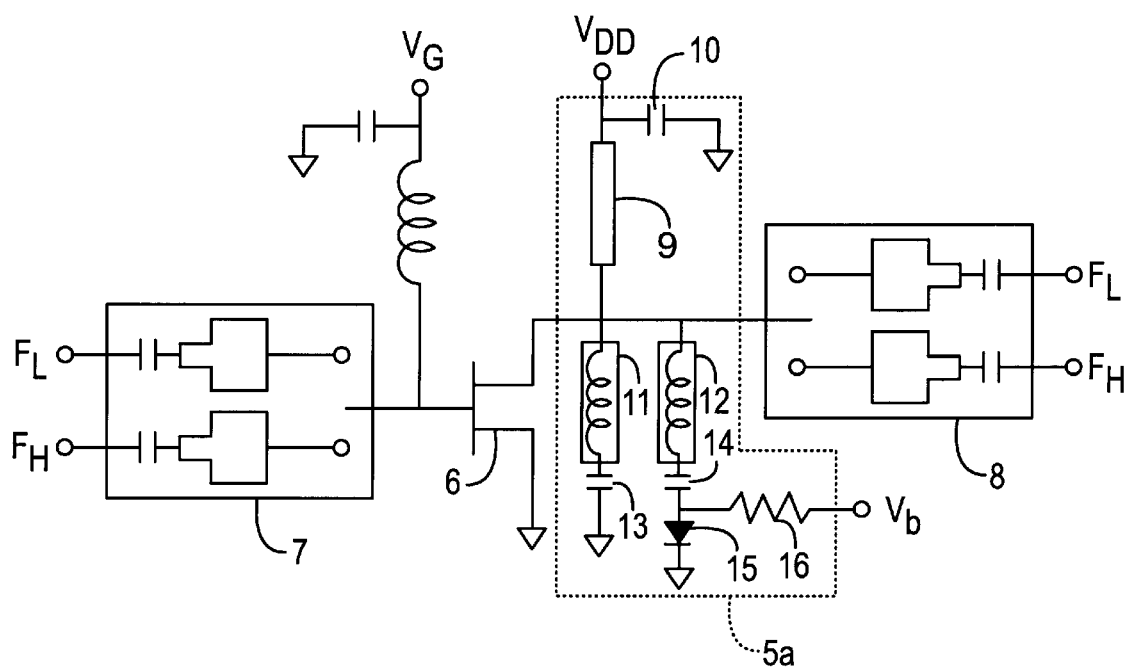
FIG. 3 is a circuit diagram showing one embodiment of the terminator and choke circuit of FIG. 2A.
Figure 4:
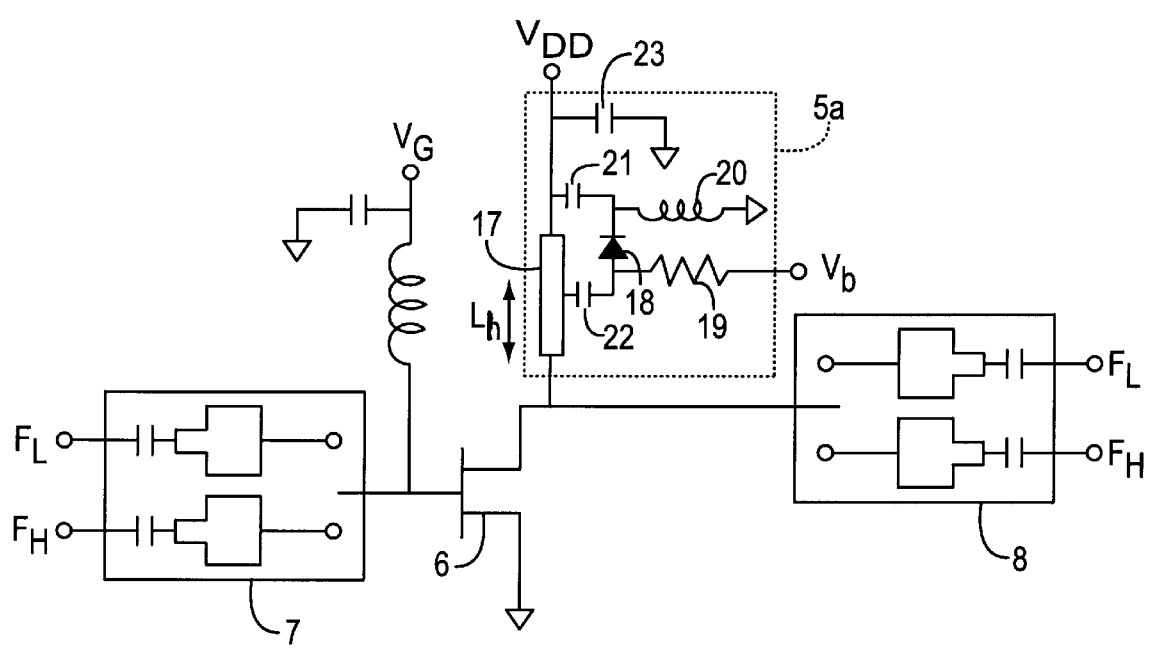
FIG. 4 is a circuit diagram showing another embodiment of the terminator and choke no circuit of FIG. 2A.
Figure 5:
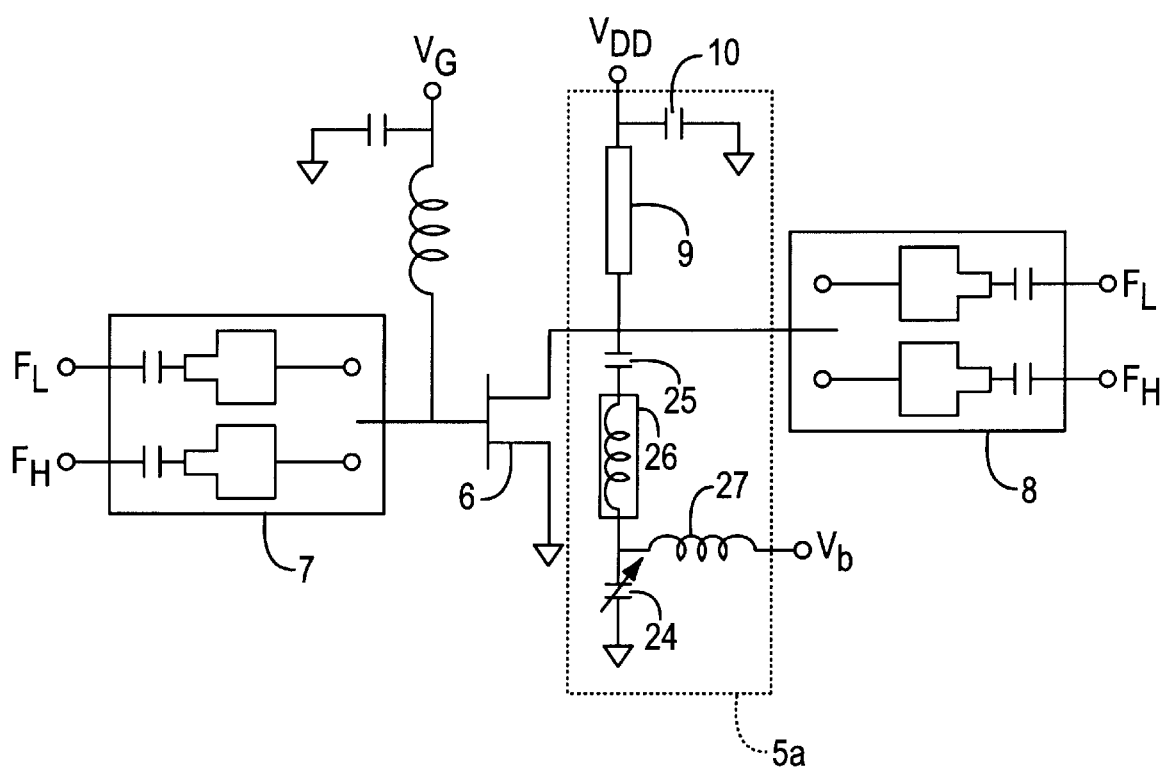
FIG. 5 is a circuit diagram showing yet another embodiment of the terminator and choke circuit of FIG. 2A.
Figure 6:
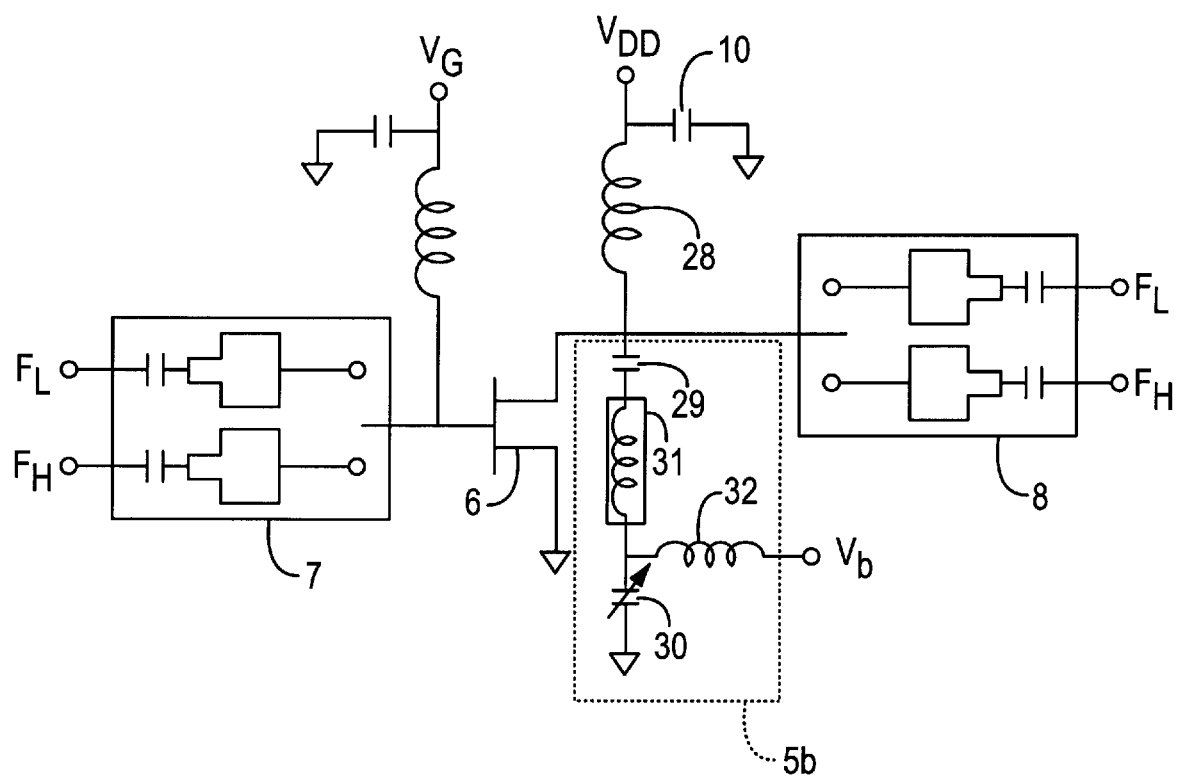
FIG. 6 is a circuit diagram showing an embodiment of the terminator circuit of FIG. 2B.
Figure 7:
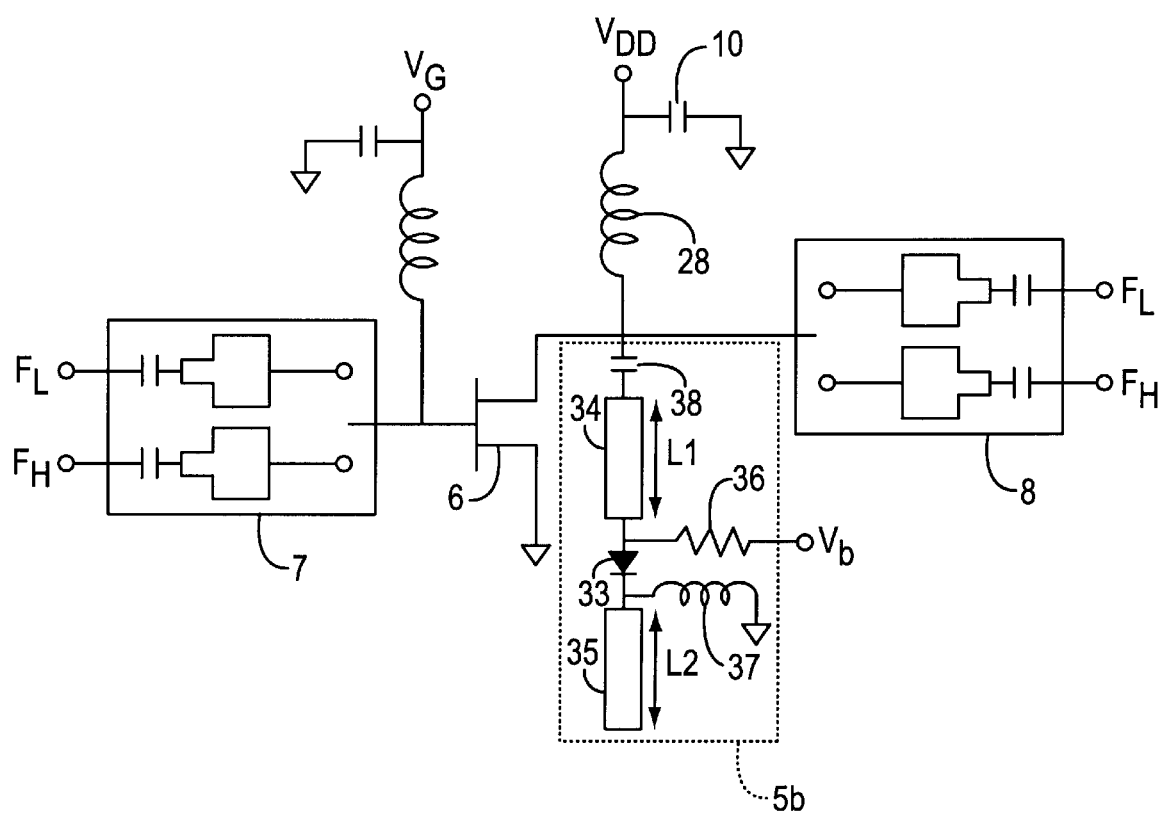
FIG. 7 is a circuit diagram showing another embodiment of the terminator circuit of FIG. 2B.
Figure 8:
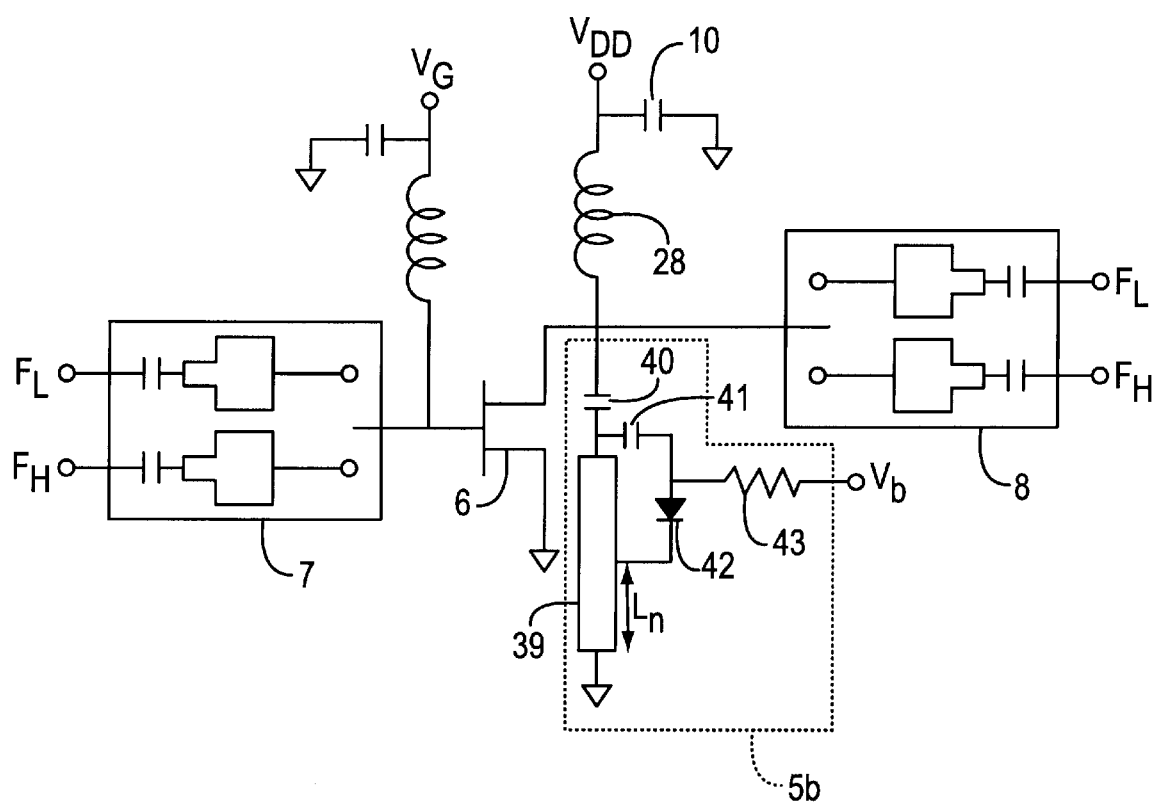
FIG. 8 is a circuit diagram showing yet another embodiment of the terminator circuit of FIG. 2B.

FIGS. 3 to 5 represent variations of the first embodiment of the present invention shown in FIG. 2A, while FIGS. 6 to 8 represent variations of the second embodiment of the present invention shown in FIG. 2B.

FIG. 3 is a circuit diagram showing a dual-band RF power amplifier in accordance with one variation of the first embodiment of the present invention. The power amplifier includes an FET 6, a dual-band input impedance matching circuit 7 connected to an input side of the FET 6, and a dual-band output impedance matching circuit 8 connected to an output side of the FET 6.

Circuit 5a functions as a biasing circuit and a second harmonic frequency termination circuit. The biasing circuit comprises a transmission line 9 coupled to a bypass capacitor 10, and the second harmonic termination circuit comprises inductors 11, 12, capacitors 13, 14, and a switch 15 for dual-band operation. The switch circuit 15 can be realized by a pin diode (as shown in the figure) or any other type of switching device. The cathode of the diode 15 is connected to ground, and a bias resistor 16 is disposed between the anode of the diode 15 and the band-select voltage Vb. An RF choke can be substituted for resistor 16.

For the lower frequency band, the pin diode 15 conducts when the band select bias voltage Vb is applied to the anode of the diode 15 through the bias resistor 16. The inductor 12, capacitor 14, and the conducting diode 15 form a series resonator to provide a low impedance at the second harmonic of the lower frequency band $f_L$. Additionally, a high impedance at the fundamental frequency is obtained at the drain terminal due to a parallel resonator formed by the transmission line 9, capacitors 10, 13, and 14, inductors 11 and 12, and the conducting diode 15, without affecting the load impedance determined by the output matching network 8. When the band-select voltage Vb is removed or zero, the diode 15 is in its off state, which effectively disconnects the series resonator 12, 14 from the FET 6.

Accordingly, for a higher frequency band $f_H$, the series resonator comprising inductor 11 and the capacitor 13 provides a low impedance at the second harmonic wave $2f_H$. Similarly, the transmission line 9, capacitors 10, 13, and inductor 11 form a high impedance at the drain terminal and serve as an RF choke in the bias circuit. In practice, the inductors 11 and 12 can be implemented in a lumped form, or distributed strip line form. The length of the transmission line 9 is determined by the values of the elements 11, 12, 13 and 14, normally about $\frac{1}{20}^{th}$ wavelength of the lower fundamental frequency $f_L$.

FIG. 4 is a circuit diagram depicting a variation of the first embodiment of the present invention. The interior point of the transmission line 17 is connected to the drain (or collector) bias terminal with a pin diode 18 therebetween. The operating band of the dual-band power amplifier is determined by whether the diode 18 is on or off. The diode is controlled by the band-select voltage Vb which is applied through a bias resistor 19 to the diode 18, and the inductor 20 provides a DC return path. The resistor 19 may be replaced by an RF choke. The capacitors 21 and 22 are used for DC de-coupling. When Vb is removed or zero, the diode is in its off state, which approximately simplifies the circuit 5a to the transmission line 17 and the bypass capacitor 23. If the length of the transmission line is designed to be approximately $1/14^{th}$ wavelength of the lower frequency band $f_L$, then circuit 5a provides a high impedance at the fundamental frequency $f_L$, and a low impedance at the second harmonic frequency $2 f_L$. On the other hand, when Vb is applied to the diode 18, the diode is in an active state, which effectively modifies the circuit 5a into a transmission line with a length of about $l_h$ and a bypass capacitor 23. If the length of the transmission line $l_h$ is designed to be approximately $1/4^{th}$ wavelength of the higher frequency band $f_H$, then circuit 5a provides a high impedance at the fundamental frequency $f_H$ and provides a low impedance at the second harmonic frequency $2f_H$ for the higher operating band. It should be noted that the actual length of $l_h$ also depends on the capacitors 21 and 22 and the pin diode 18. In addition, a further inductor may be added between capacitors 21, 22 and the diode 18 to reduce the required capacitance of each capacitor.

FIG. 5 is a circuit diagram of a another variation of the first embodiment of the present invention. The circuit 5a functions similarly to the circuit 5a in FIG. 3, except that a voltage-controlled varactor 24 replaces the pin diode 15. The capacitors 24, 25 and the inductor 26 form a series resonator to provide a low impedance at the second harmonic wave, and they also form a parallel resonator with the transmission line 9 and the bypass capacitor 10 to provide a high impedance at the fundamental wave. The inductor 26 can be implemented in a lumped form or distributed strip line form. The different band-select voltage Vb, which is provided through inductor 27, produces different capacitance in the varactor 24. Therefore, setting appropriate values of Vb enables the circuit 5a to function properly at different operating frequency bands. The higher the operating frequency, the lower is the value of capacitance of varactor 24. In other words, the high efficiency power amplifier in FIG. 5 can also work for multi-band applications.

FIG. 6 is a circuit diagram of a second embodiment of the present invention. The drain terminal of the transistor is biased via an RF inductor choke 28 and a bypass capacitor 10. The circuit 5b provides dual-band second harmonic termination. Similar to the description of FIG. 5, the circuit 5b in FIG. 6 is a series resonator formed of capacitor 29, varactor 30, and inductor 31, for providing a low impedance at the second harmonic wave. The inductor 31 can be implemented in a lumped form or distributed strip line form. The value of the band-select voltage Vb via inductor 32 is properly selected to set an appropriate capacitance of the varactor 30 for the desired resonant frequency. Again, the high efficiency power amplifier in FIG. 6 is operable in multi-band applications.

FIG. 7 is a circuit diagram of a variation of the second embodiment of the present invention. A pin diode 33 is connected between the transmission lines 34 and 35. The diode is biased by an external band select bias Vb through a bias resistor 36 connected to the anode of diode 33, and an inductor 37 is connected to the cathode of the diode 33 to provide a DC return path. An RF choke may be substituted for the resistor 36. When Vb is applied to the diode 33, the diode is in an active state, which approximately converts the circuit 5b to an open transmission line with a length of l1+l2 and a DC de-coupling capacitor 38. If the length l1+l2 of the transmission line is approximately $1/8^{th}$ wavelength of the lower frequency band $f_L$, then circuit 5b provides at the transistor output a low impedance at a second harmonic frequency $2f_L$. On the other hand, when Vb is removed or zero, the diode is in an off state, which isolates transmission line 35 from transmission line 34 and thus effectively converts the circuit 5b to an open transmission line 34 with a length of l1 along with a DC de-coupling capacitor 38. If the length l1 of the transmission line is approximately $1/8^{th}$ wavelength of the higher frequency band $f_H$, then circuit 5b provides a low impedance at the second harmonic frequency $2f_H$ at the drain terminal. It should be noted that the actual lengths of l1 and l2 are also affected by the pin diode 33.

FIG. 8 is a circuit diagram of another variation of the second embodiment of the present invention. In circuit 5b, one end of the transmission line 39 is connected to ground, and the other end is connected to a capacitor 40 and then to the drain terminal of the transistor 6. The junction in which the capacitor 40 and the transmission line 39 are connected together is also connected with a DC de-coupling capacitor 41 and a pin diode 42, and then to an interior point of the transmission line 39. The diode 42 is biased by a band-select voltage Vb through a bias resistor 43. An RF choke may be substituted for the resistor 43. When Vb is removed or zero, the diode is in an off state, which approximately converts the circuit 5b to a series resonator formed of the transmission line 39 and the capacitor 40. When the length of the transmission line 39 and the capacitor 40 are designed to resonate at the second harmonic $2f_L$ of the lower frequency $f_L$, the circuit 5b provides a low impedance at the drain terminal at the second harmonic wave $2f_L$. On the other hand, if Vb is applied to the anode of the diode 42, the diode is in an active state, which approximately reduces the transmission line 39 to an effective length of about $l_h$. The effective length of the transmission line 39 is modified by the capacitor 41 and pin diode 42. The circuit 5b then becomes a series resonator comprising a capacitor 40 and a transmission line with a length of about $l_h$. Since the transmission line 39 has an equivalently shorter length than its physical length, the resonant frequency of the series resonator would be higher than that when the diode is in an off state. Consequently, the circuit 5b provides a dual-band second harmonic termination circuit.

Although the present invention has been fully described by way of examples with reference to the accompanying drawings, it should be understood that numerous variations, modifications and substitutions, as well as rearrangements and combinations, of the preceding embodiments will be apparent to those skilled in the art without departing from the novel spirit and scope of this invention. For example, a switch other than a diode can be used between the transmission lines, between an interior point of a transmission line and its end point. The transistors can be BJTs, FETs, and the input biasing resistor can be substituted with an RF choke. Also, the phrase "second harmonic frequency termination circuit" is in regard to the second harmonic frequency of a fundamental wave. In addition, although the drawings depict the second harmonic frequency termination circuit (and combined bias circuit) connected to the output of the power transistor, it is also possible to connect the second harmonic frequency termination circuit to the input of the transistor.

What is claimed is:

1. A high efficiency dual-band RF power amplifier comprising:
    a power transistor having an input and an output;
    a dual-band input impedance matching circuit connected to the input of said power transistor for providing input impedance matching for said RF power amplifier at two desired fundamental frequency bands;
    a dual-band output impedance matching circuit connected to the output of said power transistor for providing output impedance matching for said RF power amplifier at two desired fundamental frequency bands; and
    a combined dual-band bias circuit and second harmonic frequency termination circuit connected to one or both of the output and the input of said power transistor for providing an RF choke at a fundamental wave frequency and for providing a low impedance at a second harmonic frequency with respect to the fundamental wave frequency of each band.

2. A high efficiency dual-band RF power amplifier according to claim 1, wherein said dual band bias circuit and harmonic frequency termination circuit includes a band select voltage terminal for receiving a band select voltage.

3. A high efficiency dual-band RF power amplifier according to claim 1, wherein said dual-band input impedance matching circuit comprises a passive dual-band network.

4. A high efficiency dual-band RF power amplifier according to claim 1, wherein said dual-band input impedance matching circuit comprises one of a duplexer and a switch for providing impedance matching at two frequency bands of dual-band operation.

5. A high efficiency dual-band RF power amplifier according to claim 1, wherein said dual-band output impedance matching circuit comprises a passive dual-band network.

6. A high efficiency dual-band RF power amplifier according to claim 1, wherein said dual-band output impedance matching circuit comprises one of a duplexer and a switch for providing impedance matching at two frequency bands of dual-band operation.

7. A high efficiency dual-band RF power amplifier according to claim 1, wherein said combined dual-band bias circuit and second harmonic frequency termination circuit comprises:
    (a) a bias circuit comprising:
    a transmission line and a bypass capacitor;
    said transmission line having an electric length less than a quarter wavelength of the fundamental frequency;
    a first end of said transmission line being connected to a first bias terminal and said bypass capacitor;
    a second end of said transmission line being connected to the output terminal of said power transistor; and
    (b) a second harmonic frequency termination circuit connected to said bias circuit, said second harmonic frequency termination circuit comprising:
    a first series resonant circuit comprising a cascaded inductor and capacitor, said first series resonant circuit having a first end connected to the output terminal of said power transistor and a second end connected to ground;
    a second series resonant circuit comprising a cascaded inductor and capacitor, said second series resonant circuit having a first end connected to the output terminal of said power transistor;
    a switch having a first end connected to a second end of said second series resonant circuit and a second end connected to ground;
    a bias resistor connected to the first end of said switch and to a second bias terminal for providing a band select voltage so that said switch receives a band select voltage (Vb) from said second bias terminal via said bias resistor.

8. A high efficiency dual-band power amplifier according to claim 7, wherein said transmission line has an electric length which is approximately $\frac{1}{20}^{th}$ of a wavelength of the fundamental frequency.

9. A high efficiency dual-band RF power amplifier according to claim 7, wherein:
    said switch is a diode having an anode and a cathode;
    the cathode of said diode is connected to ground; and
    the anode of said diode is connected to said bias resistor for receiving said band select bias voltage (Vb) from said second bias terminal.

10. A high efficiency dual-band RF power amplifier according to claim 1, wherein said combined dual-band bias circuit and second harmonic frequency termination circuit comprises:
    (a) a bias circuit comprising a transmission line and a bypass capacitor;
    said transmission line having an electric length of approximately a quarter wavelength at a fundamental wave frequency of a lower frequency band;
    a first end of said transmission line being connected to a first bias terminal and said bypass capacitor;
    a second end of said transmission line being connected to the output of said power transistor; and
    (b) a second harmonic frequency termination circuit comprising:
    a first DC blocking capacitor having a first end connected to the first end of said transmission line;
    a diode for switching virtually between a lower frequency path and a higher frequency path through said transmission line, said diode having a cathode connected to a second end of said first DC blocking capacitor;
    a second DC blocking capacitor having one end connected to the anode of said diode and another end coupled to an interior point of said transmission line such that the length between the interior point and the second end of said transmission line is approximately a quarter wavelength at the fundamental wave frequency of a higher frequency band;
    a bias resistor having a first end connected to the anode of said diode and a second end connected to a second bias terminal for providing band select voltage; and
    an RF choke inductor having a first end connected to the cathode of said diode and a second end connected to ground to provide a DC return path.

11. A high efficiency dual-band RF power amplifier according to claim 1, wherein said combined dual-band bias circuit and second harmonic frequency termination circuit includes:
    (a) a bias circuit comprising a transmission line and a bypass capacitor;
    said transmission line having an electric length less than a quarter wavelength of the fundamental frequency;
    a first end of said transmission line being connected to a first bias terminal and said bypass capacitor;
    a second end of said transmission line being connected to the output terminal of said power transistor; and
    (b) a second harmonic frequency termination circuit comprising:

a series resonant circuit comprising a capacitor, an inductor and a varactor, which are all cascaded, said series resonant circuit having a first end connected to the output terminal of said power transistor and a second end connected to ground; and an RF choke inductor having one end connected to said varactor and said inductor of said series resonant circuit and another end connected to a second bias terminal for providing a band select voltage.

12. A high efficiency dual-band RF power amplifier according to claim 11, wherein:

said transmission line has an electric length which is approximately $\frac{1}{20}^{th}$ of a wavelength of the fundamental frequency.

13. A high efficiency dual-band RF power amplifier comprising:

a power transistor having an input and an output;

a dual-band input impedance matching circuit connected to the input of said power transistor for providing input impedance matching for said RF power amplifier at two desired fundamental frequency bands;

a dual-band output impedance matching circuit connected to an output of said power transistor for providing output impedance matching for said RF power amplifier at two desired fundamental frequency bands; and a dual-band second harmonic frequency termination circuit connected to one of the output and the input of said power transistor for setting a low impedance for a second harmonic frequency with respect to a fundamental wave frequency of each band.

14. A high efficiency dual-band RF power amplifier according to claim 13, wherein said dual band harmonic frequency termination circuit includes a band select voltage terminal for receiving a band select voltage.

15. A high efficiency dual-band RF power amplifier according to claim 13, wherein said dual-band input impedance matching circuit comprises a passive dual-band network.

16. A high efficiency dual-band RF power amplifier according to claim 13, wherein said dual-band input impedance matching circuit comprises one of a duplexer and a switch for providing impedance matching at two frequency bands of dual-band operation.

17. A high efficiency dual-band RF power amplifier according to claim 13, wherein said dual-band output impedance matching circuit comprises a passive dual-band network.

18. A high efficiency dual-band RF power amplifier according to claim 13, wherein said dual-band output impedance matching circuit comprises one of a duplexer and a switch for providing impedance matching at two frequency bands of dual-band operation.

19. A high efficiency dual-band RF power amplifier according to claim 13, wherein said dual-band second harmonic frequency termination circuit comprises:

a series resonant circuit formed of a cascaded inductor, a capacitor and a varactor, said series resonant circuit having a first end connected to the output terminal of said power transistor and a second end connected to ground; and an RF choke inductor with one end connected to the junction between said inductor and said varactor in said series resonant circuit and another end connected to a first bias terminal.

20. A high efficiency dual-band RF power amplifier according to claim 13, wherein said dual-band second harmonic frequency termination circuit comprises:

a first transmission line and a second transmission line;

said first transmission line having an electrical length which is approximately $\frac{1}{8}^{th}$ of a wavelength at a fundamental wave frequency of a higher frequency band;

a DC blocking capacitor having one end connected to the output terminal of said power transistor and another end connected to a first end of said first transmission line;

a diode providing a switching function between said first and said second transmission lines;

said diode having an anode connected to a second end of said first transmission line and to a second bias terminal for providing a band select bias via a bias resistor;

said diode having a cathode connected to one end of said second transmission line:

an RF choke inductor connected at a first end to said cathode of said diode and a second end connected to ground;

said second transmission line having an electrical length, when added to the length of said first transmission line, equal to approximately $\frac{1}{8}^{th}$ of a wavelength at a fundamental wave frequency of a lower frequency band; and another end of said second transmission line being open.

21. A high efficiency dual-band RF power amplifier according to claim 13, wherein said dual-band second harmonic frequency termination circuit comprises:

a series resonant circuit comprising a transmission line having a first end connected to a first end of a capacitor and a second end connected to ground;

said transmission line having an electrical length less than a quarter wavelength at a fundamental wave frequency of a lower frequency band;

said capacitor having one end connected to the output terminal of said power transistor and another end connected to the first end of said transmission line;

a diode for providing a switching function between a lower frequency path and a higher frequency path of said transmission line;

said diode having a cathode coupled to an interior point of said transmission line;

a DC blocking capacitor having one end connected to the first end of said transmission line and another end connected to an anode of said diode and to a second bias terminal for providing a band select voltage (Vb) via a bias resistor.

* * * * *